United States Patent [19]

Herbst et al.

[11] 4,109,272

[45] Aug. 22, 1978

[54] LATERAL BIPOLAR TRANSISTOR

[75] Inventors: Heiner Herbst, Haar; Ruediger Mueller, Munich, both of Germany

[73] Assignee: Siemens Aktiengesellschaft, Berlin & Munich, Germany

[21] Appl. No.: 688,780

[22] Filed: May 21, 1976

[30] Foreign Application Priority Data

Jul. 4, 1975 [DE] Fed. Rep. of Germany ....... 2529951

[51] Int. Cl.² .................... H01L 27/12; H01L 29/06; H01L 29/72
[52] U.S. Cl. ......................................... 357/35; 357/4; 357/20; 357/43; 357/49; 357/53; 357/89; 357/91
[58] Field of Search ................... 357/4, 35, 49, 43, 89, 357/91

[56] References Cited

U.S. PATENT DOCUMENTS

| T861,057 | 4/1969 | Lin | 357/35 |
|---|---|---|---|
| 3,622,812 | 11/1971 | Crawford | 357/43 |
| 3,660,732 | 5/1972 | Allison | 357/43 |
| 3,846,821 | 11/1974 | Nagata et al. | 357/35 |
| 3,859,716 | 1/1975 | Tihanyi | 357/49 |
| 3,943,555 | 3/1976 | Mueller et al. | 357/91 |
| 3,997,908 | 12/1976 | Schloetterer et al. | 357/49 |
| 4,005,451 | 1/1977 | Martinelli et al. | 357/35 |

FOREIGN PATENT DOCUMENTS 2,224,574 11/1972 Fed. Rep. of Germany ............. 357/44

OTHER PUBLICATIONS

Heiman et al., Solid-State Electronics, (Pergamon Press, 1968), vol. 11, 1968, pp. 411–412.
Schroder et al., Appl. Phys. Lett., vol. 22, No. 9, 1 May 1973, pp. 455–457.

Primary Examiner—William D. Larkins
Attorney, Agent, or Firm—Hill, Gross, Simpson, Van Santen, Steadman, Chiara & Simpson

[57] ABSTRACT

A lateral bipolar transistor has a silicon film which is epitaxially deposited on an electrical insulating substrate. The silicon film is doped with impurities of a first conductivity type such that a portion of the film may be utilized as a base zone. Within the base zone an emitter zone and a collector zone are formed of the second conductivity type. A highly doped zone of the second conductivity type is produced by deep implantation at a position which is contiguous and below the base zone, below the emitter and collector zones, and at a boundary between the silicon film and the electrical insulating substrate. An insulating zone over the film and a conductive layer over the base zone are also provided. The conductive film over the base zone together with the highly doped zone below and contiguous with the base minimize surface recombination and increase device gain.

8 Claims, 1 Drawing Figure

U.S. Patent
Aug. 22, 1978
4,109,272
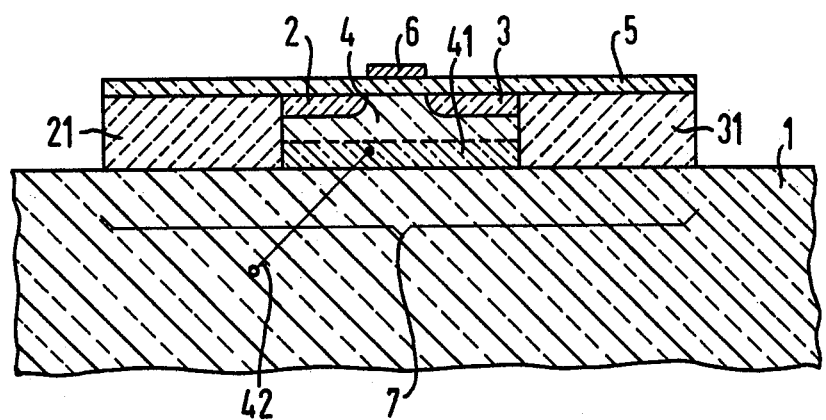

LATERAL BIPOLAR TRANSISTOR

BACKGROUND OF THE INVENTION

1. Field of the Invention

This invention relates to semiconductor devices and more particularly to semiconductor devices formed in silicon films which are epitaxially deposited on an insulating substrate.

2. Prior Art

Integrated circuits are frequently used as modules in a large system such as a data processing system. In such applications, it is necessary that integrated circuits drive the following succeeding stages. In integrated MOS circuits, such as SOS-MOS circuits, the individual component elements are arranged in silicon films which have been epitaxially deposited on an insulating substrate. In such devices, the problem arises that a high output load may lead to a delay time of such magnitude that the upper frequency limit provided by the unloaded integrated circuit can no longer be attained.

With output stages having relatively large MOS transistors with short channel lengths, the problem can be solved only with use of a large amount of space. Bipolar transistors, however, have a high enough frequency response and are suited to larger output loads.

A disadvantage of such bipolar transistors arises since it is difficult to manufacture such transistors with sufficient current amplification due to the minute diffusion length of minority charge carriers in thin silicon layers.

SUMMARY OF THE INVENTION

Accordingly, it is an object of the present invention to provide a lateral bipolar transistor in which diffusion length of minority charge carriers in thin silicon layers is lengthened.

The lateral bipolar transistor of this invention comprises a silicon film of first conductivity type which is epitaxially deposited on an electrical insulating substrate. A portion of this silicon film is utilized as a base zone. The emitter zone and a collector zone of second conductivity type are formed at lateral ends of the base zone. A highly doped zone of the second conductivity type having a higher impurity concentration than the base zone is arranged contiguously and below the base zone, below the emitter and collector zones, and at a boundary between the silicon film and the electrical insulating substrate. The highly doped zone below the base zone is formed by deep implantation. This zone may also be used as a base terminal.

The emitter of the bipolar transistor of this invention injects significantly fewer minority charge carriers into the boundary layer so that the current flow is concentrated on the zones having a higher carrier lifetime.

BRIEF DESCRIPTION OF THE DRAWING

The drawing illustrates a side cross-sectional view of the bipolar transistor of this invention.

DESCRIPTION OF THE PREFERRED EMBODIMENTS

In the FIGURE, an electrically insulating substrate on which the transistor of this invention is constructed is designated as 1. Preferably, this substrate consists of sapphire or spinel.

On substrate 1, a semiconductor layer 7 is epitaxially deposited. Preferably, this semiconductor layer is a silicon film which is approximately 0.6 to 0.8 μm thick.

Preferably, the semiconductor layer 7 is doped such that one portion 4 may later be used as the base zone. In the silicon film, an emitter terminal zone 21 and a collector terminal zone 31 are preferably produced by means of diffusion. Emitter zone 2 and collector zone 3 are produced through diffusion or by means of shallow implantation. During implantation, an aluminum layer 6, which is electrically insulated from silicon film 7 by an electrically insulating layer 5, consisting of $SiO_2$ or $Si_3N_4$, serves as a mask for the self-alignment of emitter zone 2 and collectror zone 3. Base zone 4 is located beneath aluminum layer 6. The doping of this zone amounts to approximately $10^{16}$ cm$^{-3}$. In the manufacture of a npn transistor, the doping amounts to $p = 10^{16}$cm$^{-3}$. Zones 2 and 3 and terminal zones 21 and 31 are then dopes n+.

Since the boundary layer on the insulating substrate makes a very great contribution toward recombination, the current amplification of bipolar transistors can be increased by introducing doping atoms in the boundary layer. In accordance with the invention, it is therefore proposed that a high doping level be produced in the boundary layer by means of deep implantation, such doping providing a conductivity which is opposite to the emitter and collector doping. The doping concentration must here be clearly greater than that of base zone 4. In the FIGURE, this more highly doped zone is characterized by reference numeral 41. This zone causes the emitter to inject significantly fewer minority charge carriers into the boundary layer, and causes the current flow to be concentrated in the zones having a higher carrier lifetime. Thus, the current amplification increases significantly. Also, the implanted layer 41 may be used as a base terminal.

In order to manufacture an npn transistor, a deeply implanted layer 41 is produced at the boundary area between silicon film 7 and electrical substrate 1 by means of deep implantation of boron, for example, with an accelerating voltage of approximately 250 kV. A concentration of approximately $p = 5 \cdot 10^{17}$ cm$^{-3}$ is possible as the median doping for this layer 41.

In manufacturing a lateral bipolar pnp transistor according to the teaching of this invention, the individual above described zones within slicon film 7 are doped with opposite conductivity charge carriers. The concentrations for the individual zones remain approximately the same as those described above.

By applying a suitable potential to mask 6, the surface potential of the base zone may be adjusted such that the recombination on the surface becomes minimal.

Although various minor modifications may be suggested by those versed in the art, it should be understood that I wish to embody within the scope of the patent warranted hereon, all such embodiments as reasonably and properly come within the scope of my contribution to the art.

I claim as my invention:
1. A lateral bipolar transistor comprising:
   (a) a silicon film epitaxially deposited on an electrical insulating substrate;
   (b) a portion of said silicon film forming a base zone of first conductivity type therein, said base zone portion of the silicon film having at a surface thereof a laterally extending emitter zone of depth less than the base zone and of second conductivity type and a laterally extending collector zone of depth less than the base zone and of second conductivity type providing increased emitter and collector junction surfaces with respect to said base;

(c) a highly doped zone of first conductivity type having a higher impurity concentration than said base zone arranged below and in contact with said base zone and below said laterally extending emitter and collector zones at a boundary between said silicon film and the electrical insulating substrate for reducing minority carrier recombination at the insulating substrate; and (d) an emitter terminal zone connected to the emitter zone and a collector terminal zone connected to the collector zone, said terminal zones having the same conductivity type as said emitter and collector zones and having a depth at least as great as the base zone.

2. The transistor of claim 1 in which the highly doped zone is connected to a lateral base connection contact.

3. The transistor of claim 1 in which the emitter zone, the emitter terminal zone, the collector zone and the collector terminal zone are relatively highly doped zones with respect to the base zone, and the base zone is a relatively low doped zone with respect to said emitter and collector zones.

4. The transistor of claim 1 in which the silicon film is approximately 0.6 to 0.8 μm thick, and the highly doped zone of second conductivity type is approximately 0.2 to 0.3 μm thick.

5. The transistor of claim 1 in which an electrically conductive masking is provided on an insulating layer above the base zone between the emitter zone and the collector zone, said masking being provided for the purpose of adjusting surface potential.

6. The transistor of claim 5 in which said masking consists of an element selected from the group consisting of aluminum and polycrystalline silicon.

7. A lateral bipolar transistor having a large emitter junction surface and low minority carrier recombination at an insulating substrate surface, comprising:

(a) a silcon film of first conductivity type epitaxially deposited on an insulating substrate;

(b) one portion of said silicon film forming a base zone, an inwardly projecting emitter zone and an inwardly projecting collector zone of second conductivity type at a surface of said base zone, extending laterally inwardly from lateral ends of the base zone, and of depth less than the base zone;

(c) a highly doped zone of first conductivity type in said silicon film having a higher impurity concentration than said base zone arranged below and in contact with said base zone and below said emitter and collector zones at a boundary between said silicon film and the electrical insulating substrate;

(d) collector and emitter terminal zones in said film of second conductivity type in contact with said collector and emitter zones, respectively, and of a depth at least as great as the base zone; and (e) collector, emitter, and base contacts connected to said collector, emitter, and highly doped zones, respectively.

8. The transistor of claim 7 in which an insulating layer is arranged on said film opposite said substrate and a metallic layer means is arranged over said base zone on said insulating layer for masking said base zone and for connection to a potential for minimizing surface recombination.

* * * * *